(12) United States Patent
Chen

(10) Patent No.: US 10,861,472 B2
(45) Date of Patent: Dec. 8, 2020

(54) ALGORITHM-BASED AUDIO OPTIMIZATION METHOD, INTELLIGENT TERMINAL AND STORAGE DEVICE

(71) Applicant: SHENZHEN CHUANGWEI-RGB ELECTRONIC CO., LTD, Shenzhen (CN)

(72) Inventor: Xuesi Chen, Shenzhen (CN)

(73) Assignee: SHENZHEN CHUANGWEI-RGB ELECTRONIC CO., LTD., Shenzhen (CN)

(*) Notice: Subject to any disclaimer, the term of this patent is extended or adjusted under 35 U.S.C. 154(b) by 118 days.

(21) Appl. No.: 16/319,156

(22) PCT Filed: Feb. 10, 2018

(86) PCT No.: PCT/CN2018/076101
§ 371 (c)(1),
(2) Date: Jan. 18, 2019

(87) PCT Pub. No.: WO2019/000961
PCT Pub. Date: Jan. 3, 2019

(65) Prior Publication Data
US 2020/0066286 A1 Feb. 27, 2020

(30) Foreign Application Priority Data
Jun. 27, 2017 (CN) .......................... 2017 1 0511873

(51) Int. Cl.
*H04R 3/04* (2006.01)
*H03G 3/00* (2006.01)
(Continued)

(52) U.S. Cl.
CPC ......... *G10L 19/0204* (2013.01); *H03G 9/025* (2013.01); *H04R 3/04* (2013.01)

(58) Field of Classification Search
CPC ....... H03G 5/165; H04R 3/04; H04R 2225/43
See application file for complete search history.

(56) References Cited

U.S. PATENT DOCUMENTS 7,580,536 B2 * 8/2009 Carlile ................. H04R 25/353
381/316
9,583,116 B1 2/2017 Szanto et al.
(Continued)

FOREIGN PATENT DOCUMENTS

| CN | 101667814 A | 3/2010 |
| CN | 101807427 A | 8/2010 |

(Continued)

OTHER PUBLICATIONS

The World Intellectual Property Organization (WIPO) International Search Report for PCT/CN2018/076101 dated May 9, 2018 7 Pages.

*Primary Examiner* — Jialong He
(74) *Attorney, Agent, or Firm* — Anova Law Group, PLLC

(57) ABSTRACT

The invention discloses an algorithm-based audio optimization method, an intelligent terminal and a storage device. The method includes steps of converting an original audio file on time domain into an audio file on frequency domain through Fourier transform; before extracting and matching frequency range and amplitude information of an audio signal with those of different types of existing audio test standard sound sources to determine type of the audio signal; matching corresponding frequency mapping function by function library for transform to obtain a processed audio file, obtaining an optimized audio file by inverse Fourier transform. The present invention searches a similar type of sound source by comparing and matching original audio with standard sound sources, determines the frequency mapping function for transform, maps the frequency, compresses (Continued)

or expands relevant frequency, and automatically performs tuning to achieve effect of improving sound quality.

10 Claims, 3 Drawing Sheets

(51) Int. Cl.
  *G10L 19/02* (2013.01)
  *H03G 9/02* (2006.01)

(56) References Cited

U.S. PATENT DOCUMENTS

2004/0175010 A1* 9/2004 Allegro ................ H04R 25/356
  381/316
2014/0180674 A1* 6/2014 Neuhauser ........... G10H 1/0008
  704/9

FOREIGN PATENT DOCUMENTS

| | | | |
|---|---|---|---|
| CN | 102354497 A | 2/2012 | |
| CN | 102419981 A | 4/2012 | |
| CN | 103177727 A | 6/2013 | |
| CN | 103473005 A | 12/2013 | |
| CN | 104078050 A | 10/2014 | |
| CN | 105390144 A | 3/2016 | |
| CN | 107331403 A | 11/2017 | |
| WO | 2015144243 A1 | 10/2015 | |

* cited by examiner

ALGORITHM-BASED AUDIO OPTIMIZATION METHOD, INTELLIGENT TERMINAL AND STORAGE DEVICE

CROSS-REFERENCE TO RELATED APPLICATION

This application is a national stage application of PCT Patent Application No. PCT/CN2018/076101, filed on Feb. 10, 2018, which claims priority to Chinese Patent Application No. CN201710511873.2, filed on Jun. 27, 2017, the content of all of which is incorporated herein by reference.

FIELD OF THE INVENTION

The present invention relates to the field of audio processing technology, and more particularly, to an algorithm-based audio optimization method, an intelligent terminal and a storage device.

BACKGROUND

Currently, an audio processing in a television program is mainly applied to improving a frequency response of an audio device, making a frequency response curve achieve a "flat" effect, to directly reflect a reproduction capability of a voice, so as to pursue an accuracy thereof. A different product has a different response to a different audio frequency, and the flatter the frequency response curve is, the better the reproduction of the audio is. However, a sense of a human hearing has a great relationship with an audio in each frequency band. A different amplitude and a different distribution of a frequency band gives a listener a different feeling of enjoyment. For example, an audio containing a plurality of excessive low secondary harmonics may cause a fatigue to a human ear easily; while an audio from playing a music, such as a western orchestra, may increase a brightness when increasing a volume of about 8 kHz. Thus, pursuing only a processing method of making the frequency response curve flat and the voice accurate may lose an characteristic of the voice, without being able to express the voice perfectly. A commonly used method in the prior art to improve an audio characteristic is, filtering a waveform through a frequency equalizer and adjusting a gain value in each frequency band. Through the frequency equalizer, an auditory effect of a music may be improved, but such a method is only suitable for a manual adjustment according to a personal preference style, without being able to automatically adjust the auditory effect under a plurality of different conditions and in a plurality of different scenes, thus not being able to bring a better auditory effect to an ordinary person at any time.

Therefore, the current technology needs to be improved and developed.

BRIEF SUMMARY OF THE DISCLOSURE

According to the above described defects, the purpose of the present invention is providing an algorithm-based audio optimization method, an intelligent terminal and a storage device, aiming to find a similar audio source type, by comparing an original audio with a standard source, before determining a frequency mapping function for the transform, mapping a frequency, compressing or expanding a plurality of relevant frequencies, and adjusting the audio automatically, before achieving an effect of improving the sound quality.

In order to achieve the above mentioned goals, the technical solution of the present invention to solve the technical problems is as follows:

An algorithm-based audio optimization method, wherein comprising:

converting an original audio file on a time domain into an audio file on a frequency domain through a Fourier transform in advance;

extracting and matching a frequency range and an amplitude information of an audio signal with a plurality of frequency ranges and amplitude information of a plurality of different types of existing audio test standard sound sources, and determining a type of the audio signal; and according to the type of the audio signal, transforming and obtaining a processed audio file through a matched and corresponding frequency mapping function in a function library, before obtaining an optimized audio file by an inverse Fourier transform.

The algorithm-based audio optimization method, wherein the function library comprises a first frequency mapping function and a second frequency mapping function, the first frequency mapping function and the second frequency mapping function are applied to adjusting the frequency of the audio through making a targeted change to the frequency of the audio according to a distribution range of the frequency of the audio.

The algorithm-based audio optimization method, wherein the first frequency mapping function and the second frequency mapping function are applied to making a targeted change to the frequency of the audio according to a distribution range of the frequency of the audio, comprising specifically:

dividing a frequency band of the audio in the audio file in the frequency domain into a plurality of intervals in advance;

according to the type of the audio signal, for each frequency in a frequency band of a different interval, performing a targeted processing by selecting the first frequency mapping function or the second frequency mapping function.

The algorithm-based audio optimization method, wherein the first frequency mapping function is:

$$f' = \begin{cases} 330 & (f \le 330 \text{ Hz}) \\ f & (330 \text{ Hz} < f < 1000 \text{ Hz}) \\ 1000 & (f \ge 1000 \text{ Hz}) \end{cases}$$

wherein f is the frequency of the audio in the audio file in the frequency domain, f' is the frequency of the audio in the processed audio file.

The algorithm-based audio optimization method, wherein the transforming and the processing of the first frequency mapping function to the frequency of the audio in the audio file in the frequency domain is:

transforming the frequencies in the audio file in the frequency domain less than or equal to 330 Hz into 330 Hz, applied to erasing a bass portion of the audio;

keeping the frequencies in the audio file in the frequency domain more than 330 Hz but less than 1000 Hz unchanged;

transforming the frequencies in the audio file in the frequency domain more than or equal to 1000 Hz into 1000 Hz, applied to erasing a high-pitched portion of the audio.

The algorithm-based audio optimization method, wherein the second frequency mapping function is:

$$f' = \begin{cases} 330 & (f \le 330 \text{ Hz}) \\ kf & (f > 330 \text{ Hz})(k > 1) \end{cases},$$

wherein f is the frequency of the audio in the audio file in the frequency domain, f' is the frequency of the audio in the processed audio file, k is an expansion factor.

The algorithm-based audio optimization method, wherein the transforming and the processing of the second frequency mapping function to the frequency of the audio in the audio file in the frequency domain is:

transforming the frequencies in the audio file in the frequency domain less than or equal to 330 Hz into 330 Hz, applied to erasing a bass portion of the audio;

amplifying the frequencies in the audio file in the frequency domain more than 330 Hz in k times.

The algorithm-based audio optimization method, wherein the first frequency mapping function is applied to preserving a mid-pitched portion of the audio, compressing a low frequency distribution range and a high frequency distribution range, applied to a language program that reduces a background noise and keeps the audio clear and pure;

the second frequency mapping function is applied to expanding a mid-pitched portion and a high-pitched portion of the audio, and compressing the bass portion, applied to a metal music performance emphasizing the mid-pitched portion and the high-pitched portion of the audio to represent a metal striking sound.

The algorithm-based audio optimization method, wherein setting a dividing point of the frequency band as 330 Hz and 1000 Hz, wherein a frequency less than 330 Hz is classed as a low frequency, greater than 330 Hz but less than 1000 Hz as an intermediate frequency, and greater than 1000 Hz as a high frequency.

The algorithm-based audio optimization method, wherein the first frequency mapping function is applied to transforming all of the frequencies less than or equal to 330 Hz into 330 Hz, applied to erasing the bass portion of the audio; keeping the frequencies more than 330 Hz but less than 1000 Hz unchanged; and transforming the frequencies more than or equal to 1000 Hz into 1000 Hz, applied to eliminating an information of the high-pitched portion.

The algorithm-based audio optimization method, wherein the second frequency mapping function erasing the frequencies in the audio less than or equal to 330 Hz into 330 Hz, amplifying the frequencies of the audio greater than 330 Hz, expanding a range of the frequency greater than 330 Hz, thus expanding the mid-pitched portion and the high-pitched portion of the audio, while compressing the bass portion of the audio.

The algorithm-based audio optimization method, wherein the frequency mapping function in the function library improves a performance of a sound quality of the audio by making a plurality of targeted changes to the audio frequency according to a distribution range of the audio frequency, wherein a function in the function library is applied to achieving a transformation of an audio file (F[y(t)]) into an audio file (F'[y(t)]), the transformation is a linear transformation, a nonlinear transformation, a piece wise linear transformation or a piece wise nonlinear transformation; an expression of the function is expressed piece wise according to a different dividing point of the frequency band.

The algorithm-based audio optimization method, wherein a mapping is executed between frequencies, and a related frequency is compressed or expanded through the frequency mapping function.

An intelligent terminal, wherein comprising: a processor, a memory communicating with the processor, the memory stores a computer program, applied to implementing the algorithm-based audio optimization method when being executed; the processor is applied to calling the computer program in the memory, to implement the algorithm-based audio optimization method.

A storage device, wherein the storage device stores the computer programs, the computer programs are able to be executed to achieve the algorithm-based audio optimization method.

Benefits: The present invention discloses an algorithm-based audio optimization method, an intelligent terminal and a storage device. The method comprises: converting an original audio file on a time domain into an audio file on a frequency domain through Fourier transform in advance; extracting and matching a frequency range and an amplitude information of an audio signal with a plurality of frequency ranges and amplitude information of a plurality of different types of existing audio test standard sound sources to determine a type of the audio signal; and according to the type of the audio signal, matching a corresponding frequency mapping function in a function library before transforming and obtaining a processed audio file, then obtaining an optimized audio file by inverse Fourier transform. The method of the invention searches for a similar type of sound source by comparing and matching the original audio with the standard sound sources, before determining a frequency mapping function for transform, maps the frequency, compresses or expands the relevant frequencies, automatically performs tuning before achieving an effect of improving the sound quality.

DETAILED DESCRIPTION OF EMBODIMENTS

The present invention provides an algorithm-based audio optimization method, an intelligent terminal and a storage device, in order to make the purpose, technical solution and the advantages of the present invention clearer and more explicit, further detailed descriptions of the present invention are stated here, referencing to the attached drawings and some preferred embodiments of the present invention. It should be understood that the detailed embodiments of the invention described here are used to explain the present invention only, instead of limiting the present invention.

Figure 1:
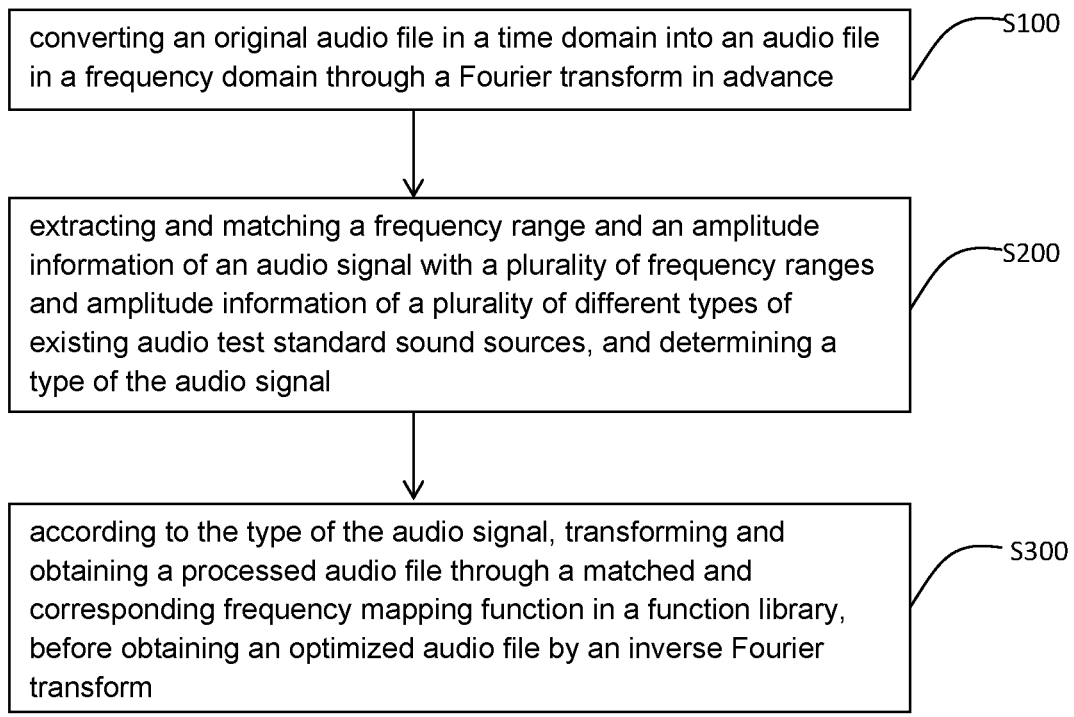
FIG. 1 illustrates a flow chart of a preferred embodiment of the algorithm-based audio optimization method disclosed in the present invention.

A preferred embodiment on an algorithm-based audio optimization method is disclosed in the present invention, shown as FIG. 1, wherein, the method comprises a plurality of following steps:

Step S100, converting an original audio file in a time domain into an audio file in a frequency domain through a Fourier transform in advance;

Specifically, in the original audio file, an audio data describes a relationship of an amplitude change following a time change, since the present invention is converting a frequency of an audio, thus it is needed to transforming an original audio file (y(t)) in a time domain (the time domain is describing a relationship between a mathematical function or a physical signal and a time, such as a time domain waveform of a signal may express a change of the signal following a change of the time) into an audio file (F[y(t)]) in a frequency domain (the frequency domain is a coordinate system applied to describing a characteristic of a signal in terms of a frequency) through a Fourier transform.

The Fourier transform is a very important algorithm in a field of digital signal processing. A Fourier principle shows that: any continuously measured timing sequences or signals, may be expressed as an infinite superposition of a plurality of sinusoidal signals on a plurality of different frequencies, and a Fourier transform algorithm created according to this principle uses a plurality of original signals directly measured to calculate a frequency, an amplitude, and a phase of the sinusoidal signals in an accumulated manner. Therefore, it may be said that, the Fourier transform algorithm converts an original signal in the time domain which is hard to process into a signal in the frequency domain (a signal spectrum) which is easy to analysis, and it is able to process and manufacture the signals in the frequency domain with a plurality of tools. And, finally, it is possible to convert the signal in the frequency domain to the signals in the time domain through an inverse Fourier transform.

A formula of the Fourier transform is:

$$F(\omega) = \mathcal{F}[f(t)] = \int_{-\infty}^{\infty} f(t)e^{-i\omega t}dt,$$

wherein the F(ω) is an image function of the f(t), while f(t) is an image original function of the F(ω).

Step S200, extracting and matching a frequency range and an amplitude information of an audio signal with a plurality of frequency ranges and amplitude information of a plurality of different types of existing audio test standard sound sources, and determining a type of the audio signal.

Specifically, when it is needed to process an audio file (F[y(t)]) into a processed audio file (F'[y(t)]) having a better sound quality, a suitable frequency mapping function shall be selected from a function library to perform a transformation. Various sound sources have various frequency ranges, for example, the frequency range of a great piano is 27 Hz-12000 Hz, a sound of a footstep is 100 Hz-9000 Hz. Selecting the frequency mapping function for any one audio file, may be based on a standard audio source as a matched information standard.

According to some characteristics of the audio signal (a frequency distribution range, a frequency amplitude information), extracting the frequency distribution range and the frequency amplitude information of the audio signal, matching with the frequency distribution ranges and the frequency information of the existing different types of the audio test standard sound sources, before finding a matched audio test standard sound source, that is, the type of the audio signal is determined, and the frequency mapping function to be transformed is also determined.

Step S300, according to the type of the audio signal, obtaining a processed audio file after transformed by a matched and corresponding frequency mapping function in the function library, before obtaining an optimized audio file by an inverse Fourier transform.

Specifically, the function library comprises a first frequency mapping function and a second frequency mapping function, the first frequency mapping function and the second frequency mapping function are applied to performing a targeted change according to the audio frequency distribution range, and adjusting the audio frequency, before improving a performance of the sound quality of the audio.

Figure 2:
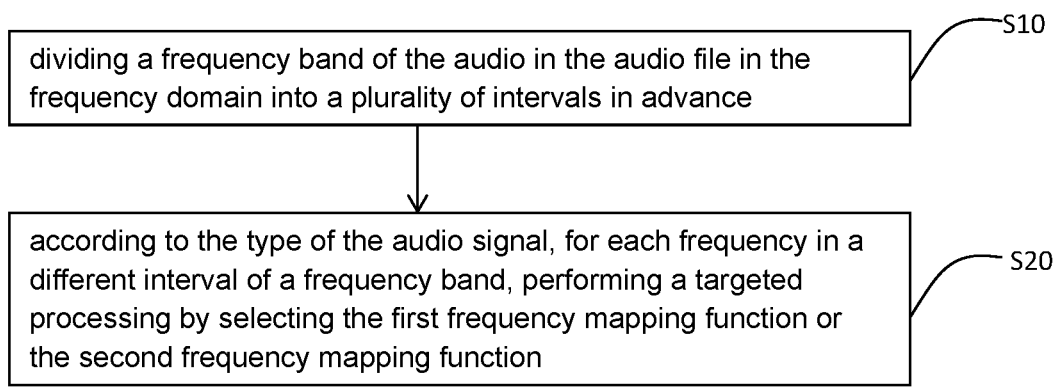
FIG. 2 illustrates a flow chart of performing a targeted change process to a frequency in an audio frequency distribution range through a frequency mapping function in a preferred embodiment of the algorithm-based audio optimization method disclosed in the present invention.

Shown as FIG. 2, the first frequency mapping function and the second frequency mapping function applied to performing a targeted change to the audio frequency according to the distribution range of the audio frequency, comprising specifically:

S10, dividing a frequency band of the audio in the audio file in the frequency domain into a plurality of intervals in advance; for example, two intervals or three intervals;

S20. according to the type of the audio signal, for each frequency in a different interval of a frequency band, performing a targeted processing by selecting the first frequency mapping function or the second frequency mapping function.

Further, the first frequency mapping function is:

$$f' = \begin{cases} 330 & (f \leq 330 \text{ Hz}) \\ f & (330 \text{ Hz} < f < 1000 \text{ Hz}), \\ 1000 & (f \geq 1000 \text{ Hz}) \end{cases}$$

wherein f is the frequency of the audio in the audio file in the frequency domain, f' is the frequency of the audio in the processed audio file.

Figure 3:
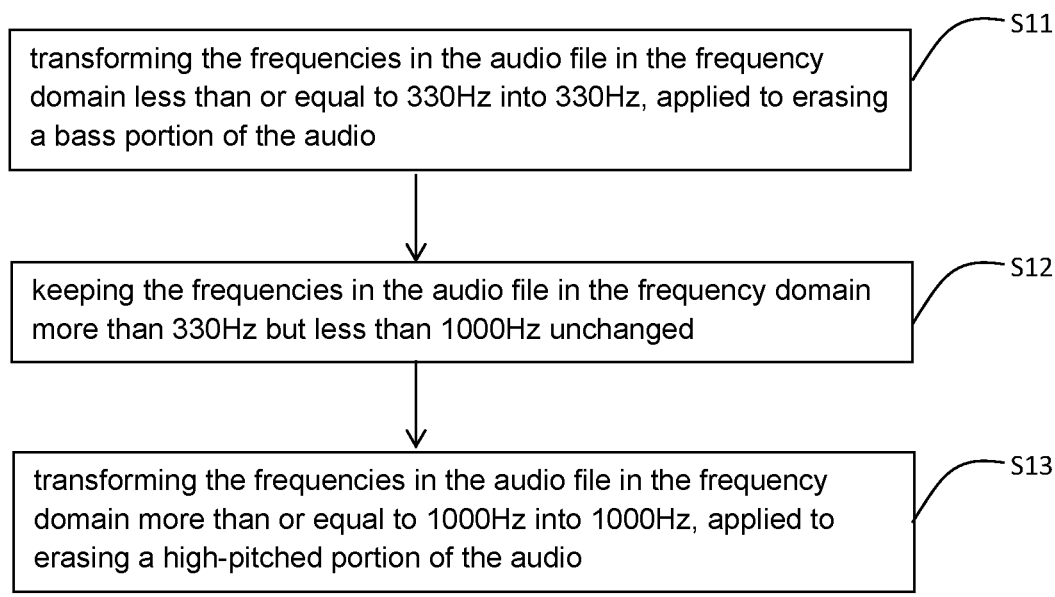
FIG. 3 illustrates a flow chart of performing a transform process to a frequency of an audio in an audio file in a frequency domain through a first frequency mapping function in a preferred embodiment of the algorithm-based audio optimization method disclosed in the present invention.

Shown as FIG. 3, the transforming and the processing of the first frequency mapping function to the frequency of the audio in the audio file in the frequency domain is (that is, a specific meaning of the formula of the first frequency mapping function):

S11. transforming the frequencies in the audio file in the frequency domain less than or equal to 330 Hz into 330 Hz, applied to erasing a bass portion of the audio;

S12. keeping the frequencies in the audio file in the frequency domain more than 330 Hz but less than 1000 Hz unchanged;

S13. transforming the frequencies in the audio file in the frequency domain more than or equal to 1000 Hz into 1000 Hz, applied to erasing a high-pitched portion of the audio.

Specifically, the present invention divides a dividing point of the frequency band as: 330 Hz and 1000 Hz, that is, the frequency smaller than 330 Hz is divided as a low frequency, the frequency more than 330 Hz but less than 1000 Hz is divided as an intermediate frequency, and the frequency greater than 1000 Hz is divided as a high frequency. The first frequency mapping function transforms all of the frequencies less than or equal to 330 Hz into 330 Hz, which erases the bass portion of the audio; keeps the frequencies more than 330 Hz but less than 1000 Hz unchanged; and transforms the frequencies more than or equal to 1000 Hz into 1000 Hz, that is, eliminating an information of the high-pitched portion. The function keeps a mid-pitched portion of the frequency, while compressing the bass portion and the high-pitched portion.

Further, the second frequency mapping function is:

$$f' = \begin{cases} 330 & (f \leq 330 \text{ Hz}) \\ kf & (f > 330 \text{ Hz})(k > 1) \end{cases},$$

wherein f is the frequency of the audio in the audio file in the frequency domain, f' is the frequency of the audio in the processed audio file, k is an expansion factor.

Figure 4:
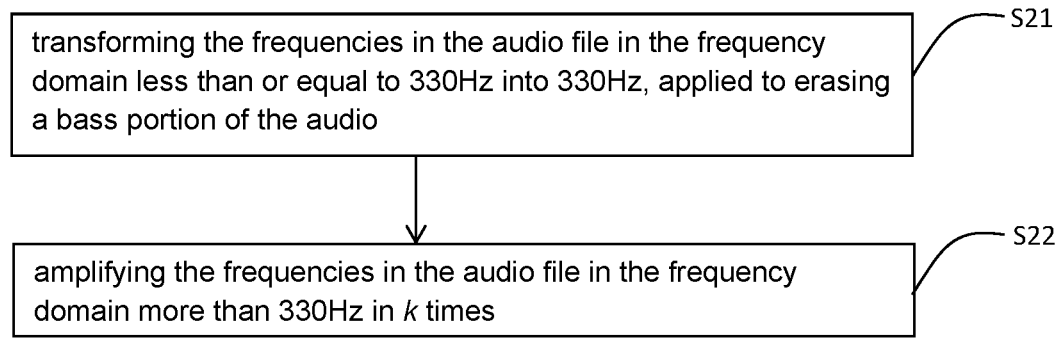
FIG. 4 illustrates a flow chart of performing a transform process to a frequency of an audio in an audio file in a frequency domain through a second frequency mapping function in a preferred embodiment of the algorithm-based audio optimization method disclosed in the present invention.

Shown as FIG. 4, the transforming and the processing of the second frequency mapping function to the frequency of the audio in the audio file in the frequency domain is (that is, a specific meaning of the formula of the second frequency mapping function):

S21. transforming the frequencies in the audio file in the frequency domain less than or equal to 330 Hz into 330 Hz, applied to erasing a bass portion of the audio;

S22. amplifying the frequencies in the audio file in the frequency domain more than 330 Hz in k times.

Specifically, the second frequency mapping function erases the audio frequencies less than or equal to 330 Hz, amplifies the audio frequencies more than 330 Hz, and expands the frequency range larger than 330 Hz, that is, amplifying the mid-pitched portion and the high-pitched portion, while compressing the bass portion, which is mainly applied to processing a metal music performance, and emphasizing the midrange and treble of the audio to express the metal strike sound. Of course, k may also be a compression factor (i.e., k<1, that compresses some frequencies in the audio).

The function library in the present invention is preferably composed by the first frequency mapping function and the second frequency mapping function, of course, other frequency mapping functions may also be included, the frequency mapping functions in the function library are mainly performing a targeted change to the audio frequency according to the audio frequency distribution range to improve a sound quality performance of the audio. The functions in the function library are applied to achieving a transformation from the audio file (F[y(t)])) to the audio file (F'[y(t)])), the transformation may be a linear transformation, a nonlinear transformation (a logarithm transformation, an exponential transformation), a piece wise linear transformation (such as the first frequency mapping function and the second frequency mapping function) or a piecewise nonlinear transformation. An expression of the function may be expressed piecewise according to a different dividing point of the frequency band (high frequency, intermediate frequency and low frequency), so as to achieve a refinement process or an abbreviated process to the audio signal. According to a plurality of requirements from a professional tuner, more expressions for different sound quality improvements are constantly added, the functions have constituted a specialized function library for audio processing. Depending on a plurality of different application requirements, different transformation functions are selected, which will selectively expand or compress a frequency in a certain frequency range.

A technical scheme of the present invention is different from a traditional method of using a filter to improve the sound quality. The present invention maps a frequency to a frequency, compresses or expands the relevant frequencies through the frequency mapping function, and modifies a timbre in a targeted manner, before achieving an effect of improving the sound quality and optimizing the auditory effect; through a contrast and a match to the standard sound source, a plurality of similar sound source types are found, before determining a mapping function of the transformation, so as to make a tune automatically, and achieve an effect of a professional tuning.

Figure 5:
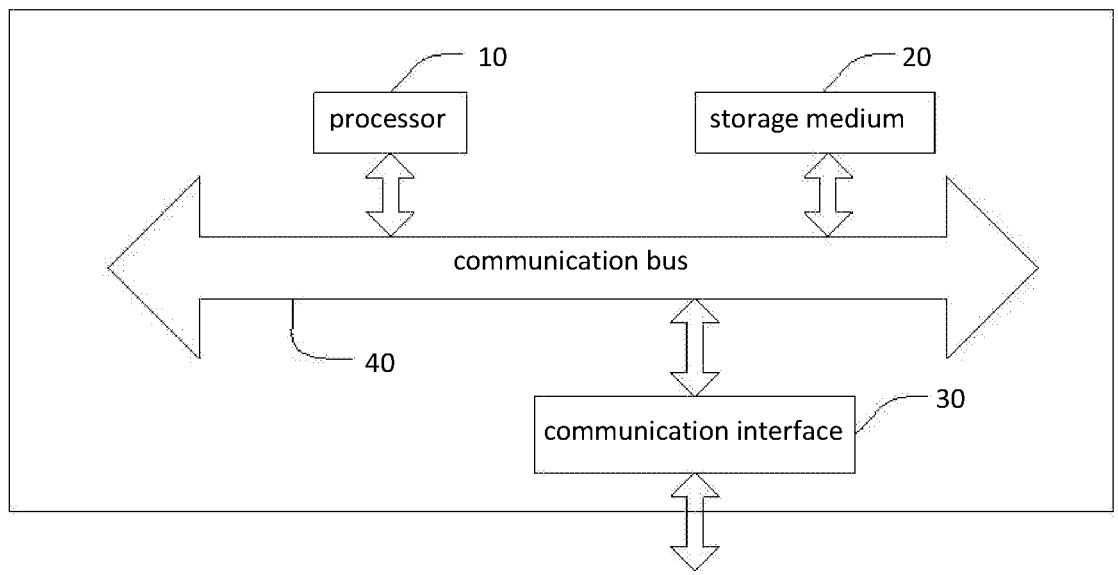
FIG. 5 illustrates a block diagram on a functional principle of an intelligent terminal in a preferred embodiment of the algorithm-based audio optimization method disclosed in the present invention.

The present invention further discloses an intelligent terminal, shown as FIG. 5, the intelligent terminal comprises: a processor 10, a memory 20, a communication interface 30 and a bus 40;

wherein the processor 10, the memory 20 and the communication interface 30 achieve an intercommunication through the bus 40;

the communication interface 30 is applied to transmitting information between a plurality of communication devices of the intelligent terminal;

the processor 10 is applied to call a computer program stored in the memory 20, applied to implementing the methods stated in a plurality of method embodiments above, for example, comprising: converting an original audio file on a time domain into an audio file on a frequency domain through a Fourier transform in advance; extracting and matching a frequency range and an amplitude information of an audio signal with a plurality of frequency ranges and amplitude information of a plurality of different types of existing audio test standard sound sources, and determining a type of the audio signal; and according to the type of the audio signal, transforming and obtaining a processed audio file through a matched and corresponding frequency mapping function in the function library, before obtaining an optimized audio file by an inverse Fourier transform.

The present invention further discloses a storage device, wherein the storage device stores a plurality of computer programs, the computer programs are able to be executed to achieve the algorithm-based audio optimization method.

All above, the present invention discloses an algorithm-based audio optimization method, an intelligent terminal and a storage device. The method comprises: converting an original audio file on a time domain into an audio file on a frequency domain through Fourier transform in advance; extracting and matching a frequency range and an amplitude information of an audio signal with a plurality of frequency ranges and amplitude information of a plurality of different types of existing audio test standard sound sources to determine a type of the audio signal; and according to the type of the audio signal, matching a corresponding frequency mapping function in a function library before transforming and obtaining a processed audio file, then obtaining an optimized audio file by inverse Fourier transform. The method of the invention searches for a similar type of sound source by comparing and matching the original audio with the standard sound sources, before determining a frequency mapping function for transform, maps the frequency, compresses or expands the relevant frequencies, automatically performs tuning before achieving an effect of improving the sound quality; compensates a defect of a sound on a hearing of a human being, thereby achieving a better hearing effect.

Of course, those skilled in the art can understand that all or part of the processes in the foregoing embodiments can be implemented by using a computer program to instruct a plurality of related hardware (such as a processor, a controller, etc.), and the program may be stored in a computer readable storage medium, the program, when being executed, may include the processes of the various embodiments on methods as described above. The storage medium described therein may be a memory, a magnetic disk, an optical disk, or the like.

It should be understood that, the application of the present invention is not limited to the above examples listed. Ordinary technical personnel in this field can improve or change the applications according to the above descriptions, all of these improvements and transforms should belong to the scope of protection in the appended claims of the present invention.

What is claimed is:

1. An algorithm-based audio optimization method, wherein comprising:
   converting an original audio file on a time domain into an audio file on a frequency domain through a Fourier transform in advance;
   extracting and matching a frequency range and an amplitude information of an audio signal with a plurality of frequency ranges and amplitude information of a plurality of different types of existing audio test standard sound sources, and determining a type of the audio signal; and
   according to the type of the audio signal, transforming and obtaining a processed audio file through a matched and corresponding frequency mapping function in a function library, before obtaining an optimized audio file by an inverse Fourier transform;
   wherein:
   the function library comprises a first frequency mapping function and a second frequency mapping function;
   the method further includes applying the first frequency mapping function and the second frequency mapping function to adjust the frequency of the audio through making a targeted change to the audio frequency according to a distribution range of the audio frequency, including: dividing a frequency band of the audio in the audio file in the frequency domain into a plurality of intervals in advance; and according to the type of the audio signal, for each frequency in a frequency band of a different interval, performing a targeted processing by selecting the first frequency mapping function or the second frequency mapping function; and
   the first frequency mapping function is:

$$f' = \begin{cases} 330 & (f \leq 330 \text{ Hz}) \\ f & (330 \text{ Hz} < f < 1000 \text{ Hz}) \\ 1000 & (f \geq 1000 \text{ Hz}) \end{cases},$$

wherein f is the frequency of the audio in the audio file in the frequency domain, f' is the frequency of the audio in the processed audio file.

2. The algorithm-based audio optimization method according to claim 1, wherein the transforming and processing of the first frequency mapping function to the frequency of the audio in the audio file in the frequency domain is:
   transforming the frequencies in the audio file in the frequency domain less than or equal to 330 Hz into 330 Hz, applied to erasing a bass portion of the audio;
   keeping the frequencies in the audio file in the frequency domain more than 330 Hz but less than 1000 Hz unchanged;
   transforming the frequencies in the audio file in the frequency domain more than or equal to 1000 Hz into 1000 Hz, applied to erasing a high-pitched portion of the audio.

3. The algorithm-based audio optimization method according to claim 2, wherein setting a dividing point of the frequency band as 330 Hz and 1000 Hz, wherein a frequency less than 330 Hz is classed as a low frequency, greater than 330 Hz but less than 1000 Hz as an intermediate frequency, and greater than 1000 Hz as a high frequency.

4. The algorithm-based audio optimization method according to claim 3, wherein the first frequency mapping function is applied to transforming all of the frequencies less than or equal to 330 Hz into 330 Hz, applied to erasing the bass portion of the audio; keeping the frequencies more than 330 Hz but less than 1000 Hz unchanged; and transforming the frequencies more than or equal to 1000 Hz into 1000 Hz, applied to eliminating an information of the high-pitched portion.

5. The algorithm-based audio optimization method according to claim 3, wherein the second frequency mapping function transforming the frequencies in the audio less than or equal to 330 Hz into 330 Hz, amplifying the frequencies of the audio greater than 330 Hz, expanding a range of the frequency greater than 330 Hz, thus expanding the mid-pitched portion and the high-pitched portion of the audio, while compressing the bass portion of the audio.

6. The algorithm-based audio optimization method according to claim 1, wherein the second frequency mapping function is:

$$f' = \begin{cases} 330 & (f \leq 330 \text{ Hz}) \\ kf & (f > 330 \text{ Hz})(k > 1) \end{cases},$$

wherein f is the frequency of the audio in the audio file in the frequency domain, f' is the frequency of the audio in the processed audio file, k is an expansion factor.

7. The algorithm-based audio optimization method according to claim 6, wherein the transforming and the processing of the second frequency mapping function to the frequency of the audio in the audio file in the frequency domain is:
   transforming the frequencies in the audio file in the frequency domain less than or equal to 330 Hz into 330 Hz, applied to erasing a bass portion of the audio;
   amplifying the frequencies in the audio file in the frequency domain more than 330 Hz in k times.

8. The algorithm-based audio optimization method according to claim 1, wherein the first frequency mapping function is applied to preserving an mid-pitched portion of the audio, compressing a frequency in a low frequency distribution range and a high frequency distribution range, applied to a language program that reduces a background noise and keeps the audio clear and pure;
   the second frequency mapping function is applied to expanding a mid-pitched portion and a high-pitched portion of the audio, and compressing the bass portion, applied to a metal music performance emphasizing the mid-pitched portion and the high-pitched portion of the audio to represent a metal striking sound.

9. An intelligent terminal, wherein comprising: a processor, a memory communicating with the processor, the memory stores a computer program, applied to implementing the algorithm-based audio optimization method according to claim 1 when being executed; the processor is applied to calling the computer program in the memory, and implementing the algorithm-based audio optimization method according to claim 1.

10. A storage device, wherein the storage device stores the computer program, the computer program is able to be executed to achieve the algorithm-based audio optimization method according to claim 1.

\* \* \* \* \*